US006504938B1

(12) United States Patent
Anderson et al.

(10) Patent No.: US 6,504,938 B1
(45) Date of Patent: Jan. 7, 2003

(54) DUAL-CHAMBER LOUDSPEAKER

(75) Inventors: Jeffrey S. Anderson, Camas, WA (US); Jason N. Linse, Portland, OR (US); Raymond K. Weikel, Camas, WA (US)

(73) Assignee: Logitech Europe S.A., Romanel-sur-Morges (CH)

( * ) Notice: Subject to any disclaimer, the term of this patent is extended or adjusted under 35 U.S.C. 154(b) by 0 days.

(21) Appl. No.: 09/684,024

(22) Filed: Oct. 6, 2000

(51) Int. Cl.[7] .......................... H04R 25/00; H04R 1/02; H05K 5/00; A47B 81/06

(52) U.S. Cl. ....................... 381/335; 381/150; 381/349; 381/351; 181/145; 181/198; 181/146

(58) Field of Search ................................ 381/335, 345, 381/346, 333, 150, 351, 349, 350; 181/198, 145, 146, 160, 155, 156

(56) References Cited

U.S. PATENT DOCUMENTS 4,875,546 A * 10/1989 Krnan ........................ 181/160
5,010,977 A 4/1991 Furukawa et al.
5,025,885 A * 6/1991 Froeschle .................... 381/90
5,629,502 A 5/1997 Nakano
5,714,721 A * 2/1998 Gawronski et al. ......... 181/156
5,937,074 A * 8/1999 Carver ....................... 381/395
6,144,751 A * 11/2000 Velandia ..................... 381/345
6,169,811 B1 * 1/2001 Croft, III .................... 381/186
6,259,798 B1 * 7/2001 Perkins et al. .............. 381/397

* cited by examiner

*Primary Examiner*—Forester W. Isen
*Assistant Examiner*—Laura A. Grier
(74) *Attorney, Agent, or Firm*—Ipsolon LLP

(57) ABSTRACT

An economical and compact dual-chamber loudspeaker includes a small driver received within a partition extending between, and in acoustical and pneumatic communication with, both a front and a back chamber, each of which has a relatively small volume. An elongated vent is in acoustical and pneumatic communication between the front and back chamber at a substantially planar opening in the partition. The drone cone is in acoustical and pneumatic communication between the front chamber and the outside environment at a substantially planar opening in the housing. The two openings are spaced apart and generally parallel to each other. In a preferred embodiment, the volume of the chambers is minimized by securing an elongated concentric vent around the vent extending between the front and back chambers. In an alternative preferred embodiment, there are at least two elongated vents in acoustical and pneumatic communication with the front and back chambers, and each vent is spaced equal distance from the driver and from each other such that they distribute the pneumatic loads between the front and back chambers evenly, thereby preventing pneumatic forces emanating from the vents from applying asymmetric force to the drone cone.

59 Claims, 3 Drawing Sheets

DUAL-CHAMBER LOUDSPEAKER

FIELD OF THE INVENTION

The present invention relates to loudspeakers and, in particular, to a dual-chamber loudspeaker, preferably used as a compact subwoofer in a multimedia computer speaker system.

BACKGROUND AND SUMMARY OF THE INVENTION

A typical broadband loudspeaker system usually includes separate loudspeakers for providing the different frequency components of the broadband acoustic signal. These separate loudspeakers are coupled together by a suitable crossover network for applying the appropriate frequency component of the electrical input drive signal to each of the loudspeakers.

Most listeners are not able to localize the source of low frequency sounds below about 150 Hz. Accordingly, it is common practice within a typical broadband loudspeaker system to provide only one loudspeaker that operates exclusively below about 150 Hz. This type of loudspeaker is commonly referred to as a subwoofer, and under ideal conditions, its placement remains unnoticeable to the typical listener. Therefore it can be placed conveniently out of sight without compromising the quality of the sound it generates.

An un-mounted or unbaffled subwoofer driver operated in free-air exhibits large mechanical excursions as it approaches its resonant frequency. This undesirable characteristic potentially leads to massively distorted output or even self-destruction of the driver. Moreover, since there is no isolation of the back pressure wave from the front pressure wave in un-mounted subwoofer drivers, the back pressure wave will cancel out the front and produce no bass frequencies. Accordingly, it is customary to mount the subwoofer driver into a housing, so that air in the housing will control this motion.

The use of broadband loudspeaker systems with personal computers is gaining popularity. For example, high fidelity sound is desirable with many multimedia computer applications, such as presentations, games, DVD movies, and the like. Moreover, as the applications for using a personal computer expand, the need for high fidelity sound with these applications will also increase.

The typical personal computer rests on a desk, and customers expect computer-related peripherals to be relatively inexpensive. Accordingly, it is desirable to make multimedia computer-related loudspeaker systems as compact and economical as possible, but without compromising sound quality. Because compactness and economy are desirable, small, wide-band drivers (e.g., 3-inch diameter cone speaker drivers) are commonly used.

Known subwoofer designs are typically expensive to manufacture, too large to be effectively used with a multimedia computer, or fail to effectively suppress sound frequencies above about 150 Hz. For example, the typical subwoofer driver secured to a sealed housing requires a large housing to operate effectively. Accordingly, it neither fits effectively near a computer, nor is it particularly economical to manufacture.

More recently, some subwoofer designs have employed a small driver that is secured within an intermediate partition between front and back chambers of a housing (i.e., a dual chamber housing). Passive resonant devices, such as vent ports, vent tubes and sealed drone cones, pneumatically and acoustically couple the back and front chambers with each other, and the front chamber with the outside environment. These types of systems are commonly referred to as dual-chamber loudspeakers, or loudspeakers having series vented band-pass alignment. U.S. Pat. No. 4,875,546 to Krnan ("Krnan") is an example of a known dual-chamber loudspeaker. In particular, Krnan teaches that undesirable higher frequencies are attenuated without the need for electrical-filtering by appropriately sizing the two chambers, driver, and related interconnecting passive resonant devices therebetween. Krnan notes that the size of each chamber and the mechanical parameters of the passive resonant devices are a function of the "cut off" frequency above which acoustic output signals of the loudspeaker are to be attenuated. For optimal results, Krnan teaches that the volume of the back chamber should be related to the volume of the front chamber by a factor of from about 1:1 to 6:1, with optimal performance being achieved with a ratio of about 2.5:1.

Similarly, U.S. Pat. No. 5,025,885 to Froeschle ("Froeschle") teaches that desirable results can be achieved by making the volume of the back chamber "substantially smaller" than the volume of the front chamber.

Dual-chamber loudspeakers, such as those disclosed in Krnan and Froeschle, offer significant improvements over subwoofers having a driver secured within a conventional sealed or vented housing. They are smaller in size, use smaller drivers, are more efficient, and have improved low frequency bass reproduction than a conventional sealed housing subwoofer.

However, while these known dual-chamber loudspeakers advance various theories on how to select the proper size of the chambers and interconnecting ports, they do not teach or suggest the most optimal orientation and construction of the passive resonant devices with respect to each other and the driver. As a result, the size of the chambers, and accordingly, the overall size of the housing, cannot be minimized as small as possible, and sound quality is inadvertently compromised.

In particular, as the overall size of the loudspeaker is reduced, the available volume of the front and back chambers is also minimized. Accordingly, the velocity of air being transmitted though the ports increases, thereby increasing the likelihood of the system generating undesirable high frequency sounds associated with port turbulence, driver excursion limitations, harmonic distortion, and the like. Thus, known dual-chamber loudspeakers must be sized large enough to either minimize these undesirable characteristics, or to include devices, such as a drone cone between the front and back chamber, aimed at reducing the generation and transfer of these undesirable sounds. In practice, the required overall size of the known dual-chamber loudspeakers is often too large to be used effectively in some environments, such as with a multi-media computer loudspeaker system.

Accordingly, the present invention provides an economical and extremely compact dual-chamber loudspeaker, the size of which does not compromise sound quality. It has a relatively small driver received within a partition extending between, and in acoustical and pneumatic communication with, both a front and a back chamber, each of which has a relatively small volume. An elongated vent is in acoustical and pneumatic communication between the front and back chamber at a substantially planar opening in the partition. A sealed drone cone is in acoustical and pneumatic communication between the front chamber and the outside environment at a substantially planar opening in the housing. The two openings are spaced apart and generally parallel to each other, with a portion of the opening in the partition overlapping the opening in the housing, when viewed from the front of the housing.

In a first preferred embodiment, undesirable high frequency sounds associated with driver operation and amplifier clipping are further minimized by directing the driver to face into the back chamber, and the volume of the back chamber is minimized by securing an elongated concentric tube around the port extending between the front and back chambers to achieve the same tuning frequency as a larger chamber. An alternative preferred embodiment includes the centers of the driver and drone cone being aligned, and at least two ports in acoustical and pneumatic communication with the front and back chambers, each port is spaced equal distance from the driver and from each other such that they distribute the pneumatic loads between the front and back chambers evenly, thereby preventing pneumatic forces emanating from the ports from applying asymmetric force to the drone cone.

Additional objects and advantages of the present invention will be apparent from the detailed description of the preferred embodiment thereof, which proceeds with reference to the accompanying drawings.

DETAILED DESCRIPTION OF PREFERRED EMBODIMENTS

An economical and compact dual-chamber loudspeaker having superior sound quality is shown in FIGS. 1–7.

A. First Preferred Embodiment

Figure 1:
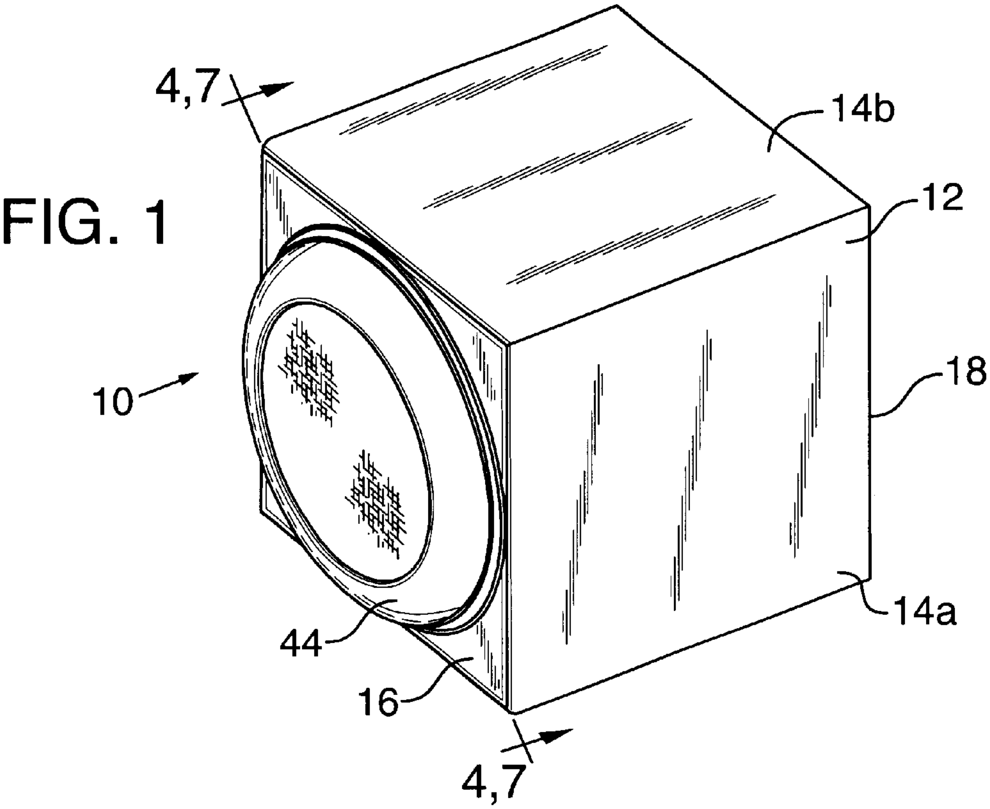
FIG. 1 is an isometric view of a dual-chamber loudspeaker in accordance with a first preferred embodiment of the present invention.
Figure 2:
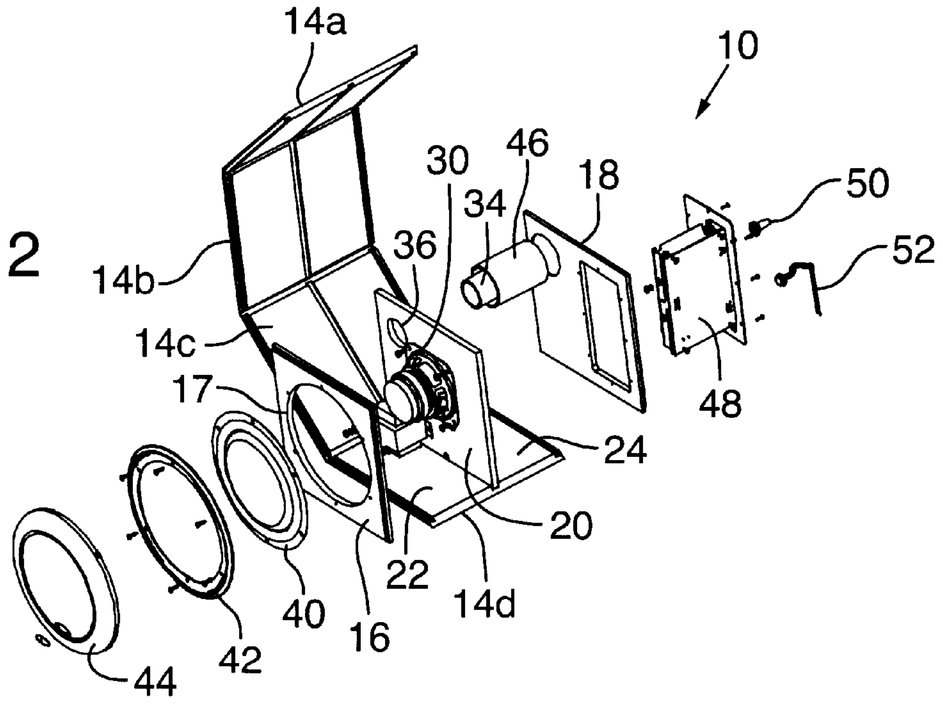
FIG. 2 is an exploded isometric view of the dual-chamber loudspeaker of FIG. 1.
Figure 3:
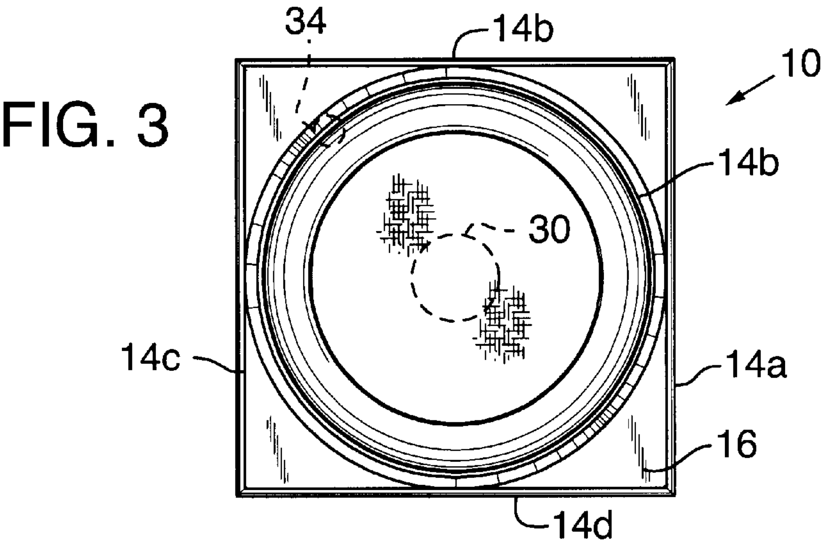
FIG. 3 is a front elevation view of the dual-chamber loudspeaker of FIG. 1 showing a possible orientation of the driver, elongated vent, and drone cone.
Figure 4A:
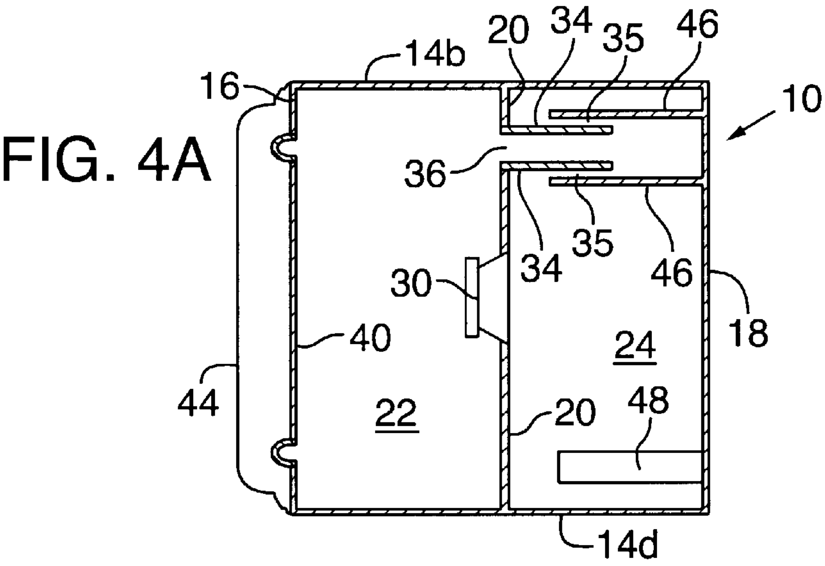
FIG. 4A is a side cross-sectional view of the dual-chamber loudspeaker of FIG. 1 taken along line 4—4 in FIG. 1.

In a first preferred embodiment, shown in FIGS. 1–4A, the loudspeaker 10 includes a conventional sealed housing 12 having a left side 14*c*, right side 14*a*, top portion 14*b*, bottom portion 14*d*, back side 18, and a generally planar front panel 16. As best shown in FIGS. 2 and 4A, a generally planar partition 20 is secured within the housing 12 and aligned substantially parallel with the front panel 16, defining a sealed front chamber 22 and a sealed back chamber 24.

The front panel 16 includes an opening 17 sized to operably receive a passive resonant device, such as a conventional drone cone 40 as best shown in FIG. 2. Preferably, the drone cone 40 is secured to the front panel 16 of the housing 12 with a mounting ring 42 creating a pneumatic seal between the drone cone 40 and front panel 16. A raised screen 44, secured to the front panel 16, covers and protects the drone cone 40. The screen 44 is preferably spaced apart from the drone cone 40 so that the drone cone 40 can move freely within the opening 17 in the front panel 16. Preferably, the drone cone 40 is substantially flat-shaped as best shown in FIG. 2, rather than a conventional cone shape. The flat shape allows the cone to be operably supported by the front panel, without the need for a conventional spider support assembly commonly used to support a traditional cone-shaped drone cone.

The partition 20 includes an opening sized to operably receive a conventional driver 30, which is in pneumatic and acoustical communication between the front and back chambers, 22, 24, respectively. The driver 30 is pneumatically sealed to the partition 20 with known materials and methods. Preferably, the driver 30 is secured to the partition 20 such that it faces into the back chamber 24, with the center of the driver aligned with the center of the drone cone 40 when viewed from the front of the loudspeaker 10 as best shown in FIG. 3. Directing the driver 30 to face the back chamber 24 directs the majority of undesirable high frequency sounds generated by driver excursion limitations, amplifier clipping, harmonic distortion, and the like into the back chamber 24, thereby reducing the likelihood of them escaping from the loudspeaker 10.

Preferably, the diameter of the drone cone 40 is larger than the diameter of the driver 30, and the drone cone 40 has a lower resonance than the resonance of the driver 30.

The partition also includes a port hole 36 (FIG. 2), sized to operably receive a hollow elongated vent 34, which is preferably a cylindrical tube extending from the partition 20 into the back chamber 24. The elongated vent 34 is in pneumatic and acoustic communication between the front and rear chambers, 22, 24, respectively. More preferably, the drone cone 40 is aligned with a portion of the port hole 36 when viewed from the front of the housing as shown in FIG. 3 such that the drone cone 40 has minimal overlap over a portion of the port hole 36 at the drone cone's outer diameter. Accordingly, asymmetric deflection of the drone cone 40 by air exiting the elongated vent 34 is reduced.

An elongated hollow concentric vent 46 is secured to the back side 18 of the housing 12, and pneumatically sealed to the back side 18 with known materials and methods. As best shown in FIG. 4A, the concentric vent 46 extends from the back side 18 over the extended portion of the elongated vent 34 with a defined gap 35 therebetween such that air can travel between the front and back chambers, 22, 24, respectively, by traveling between the gap 35 and through the elongated vent 34, concentric vent 46 and port hole 36. This concentric vent 46 allows the length of the vent to be the equivalent of one much longer non-concentric vent.

Preferably, and in order to minimize the profile of the loudspeaker 10, related loudspeaker electronics such as an amplifier and associated loudspeaker circuitry are secured within these chambers as shown in FIG. 2. More preferably, the back side 18 includes an opening for detachably receiving an electronics frame 48 containing such loudspeaker electronics, thereby permitting easy manufacturing and repair of the loudspeaker. The electronics frame 48 is pneumatically sealed to the back side 18 of the loudspeaker with known means and methods. Control knobs 50, power and control cables 52, and the like can be positioned on the exterior surface frame as shown. The moving air between the front and back chambers, 22, 24, respectively, during operation of the loudspeaker 10 serves to cool these electronics, thereby prolonging their useful life.

While the volumes of the front and back chambers, 22, 24, respectively, are important factors in tuning the loudspeaker 10, it can be appreciated that the size of the port hole 36 and the related diameter of the elongated vent 34, the lengths of the elongated vent 34 and concentric vent 46, and the width of the gap 35 between the two vents can be modified to select and tune an optimal Helmholtz resonator effect, thereby allowing the two chambers 22, 24, respectively, to be tuned relatively easily for a given volume in the chambers. Moreover, the parameters of the drone cone 40 and driver 30 can be selected to optimize the performance of the loudspeaker 10. Accordingly, the loudspeaker system 10 can easily be optimized for any given chamber sizes and ratios. Therefore, the overall size of the housing 12 can be minimized, without compromising the quality of the sound produced by the loudspeaker 10.

The present invention is preferably tuned to operate as series-vented band-pass alignment subwoofer. Therefore, the back chamber 24 is preferably tuned to have a low frequency cut-off of about 35 Hz, and the front chamber 22 is tuned to have a high frequency cut-off of about 150 Hz. As a result, high frequency tones above about 150 Hz are suppressed without the need for electrical filtering. Of course, it can be appreciated that the present invention could be tuned to any desirable frequencies.

More preferably, and as best shown in FIG. 1, the height and width of the front panel 16 is no larger than necessary to accommodate the drone cone 40. Similarly, the height and width of the left, right, top and bottom sides 14*c,* 14*a,* 14*b,* and 14*d,* respectively, are not larger than necessary to accommodate the enclosed electronics, driver 30, and elongated vents 34, 46, as shown. In practice, acceptable dual-chamber subwoofer performance can be achieved with the configuration of the present invention by using a housing 12 having a height, length and width only slightly larger than the diameter of the drone cone 40 secured to the front panel 16. Accordingly, the loudspeaker's housing 12 can be substantially cube shaped without compromising sound quality.

One characteristic associated with reducing the overall volume of the front and back chambers, 22, 24, respectively, is that the velocity of air traveling through the elongated vents 34, 46, respectively, necessarily increases. As a result, undesirable high frequency sounds associated port turbulence and the like also increase. In addition, traditional undesirable high frequency sounds associated with amplifier clipping and driver excursion limitations also produce undesirable high frequency sounds within the loudspeaker. However, these high frequency sounds are prevented from escaping into the outside environment by using the sealed drone cone 40 between the front chamber and the outside environment, thereby preventing them from being discernable to a listener.

B. Second Preferred Embodiment

Figure 4B:
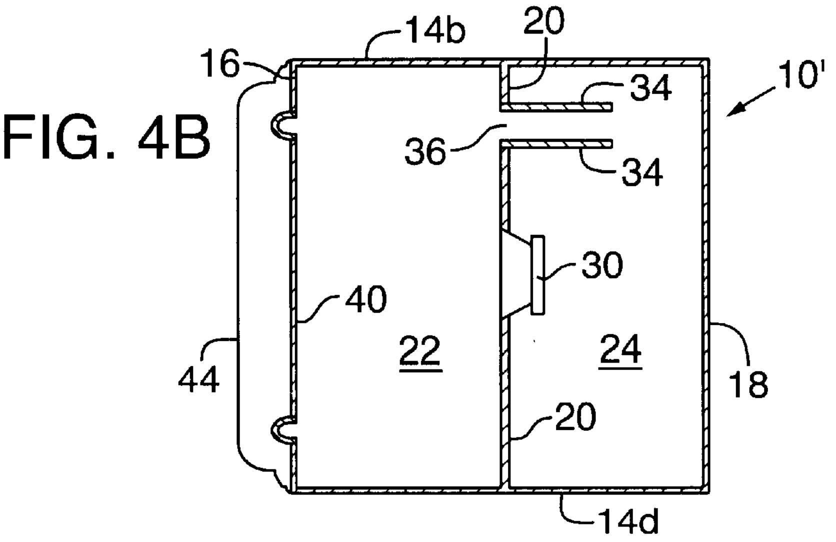
FIG. 4B is a side cross-sectional view of a dual-chamber loudspeaker in accordance with a second preferred embodiment of the present invention.

A second preferred embodiment of the loudspeaker 10' of the present invention is disclosed in FIG. 4B, and it has the same overall exterior appearance and size as shown in FIG. 1. In general, the loudspeaker 10' of this embodiment has the same basic elements and construction of the first preferred embodiment, and is presented to show an alternative preferred configuration of the arrangement of these elements. Accordingly, in order to avoid undue repetition, unless specifically identified otherwise below, reference numerals refer to like numbered elements having a like orientation and configuration as those elements identified in the discussion of the first preferred embodiment.

In the second preferred embodiment, the driver 30, which is preferably centrally aligned with the drone cone 40 when viewed from the front, and faces the front chamber 22. Also, the hollow elongated vent 34 is in pneumatic and acoustic communication between the front and rear chambers, 22, 24, respectively, and aligned so that the drone cone 40 overlaps only a portion of the elongated vent 34 when viewed from the front of the loudspeaker 10'. In this embodiment, there is no need for the concentric vent 46 encircling the elongated vent.

Centrally aligning the driver 30 with the drone cone 40 and directing the driver 30 towards the drone cone 40 helps prevent asymmetric pneumatic forces from acting on the drone cone 40. Additionally, undesirable noises emanating from the rear of the driver, such as pole vent turbulence can be trapped in the rear chamber. Moreover, offsetting the overlap between the elongated vent 34 and drone cone 40 helps reduce the amount of asymmetric deflection of the drone cone 40 caused by air exiting the elongated vent during operation of the loudspeaker 10'.

C. Third Preferred Embodiment

Figure 5:
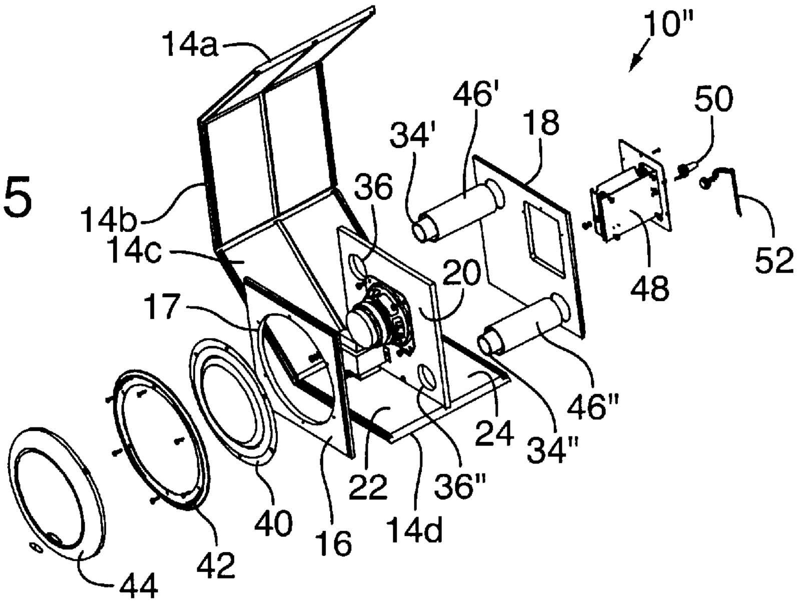
FIG. 5 is an exploded isometric view of a dual-chamber loudspeaker in accordance with a third preferred embodiment of the present invention.
Figure 6:
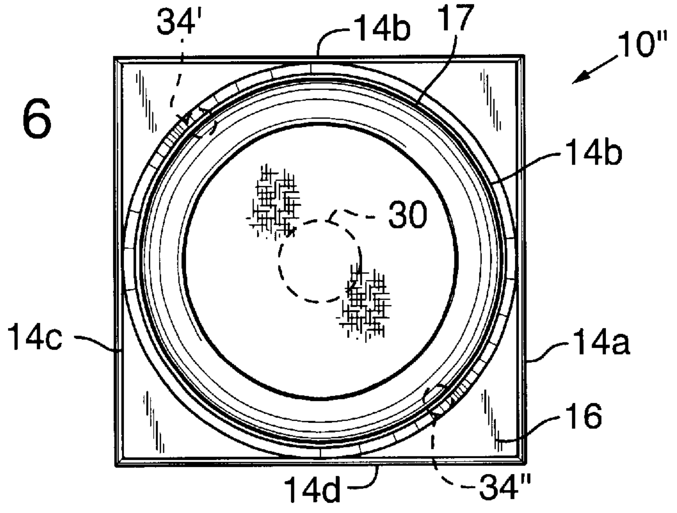
FIG. 6 is a front elevation view of the dual-chamber loudspeaker of FIG. 5 showing a possible orientation of the driver, elongated vents, and drone cone.
Figure 7:
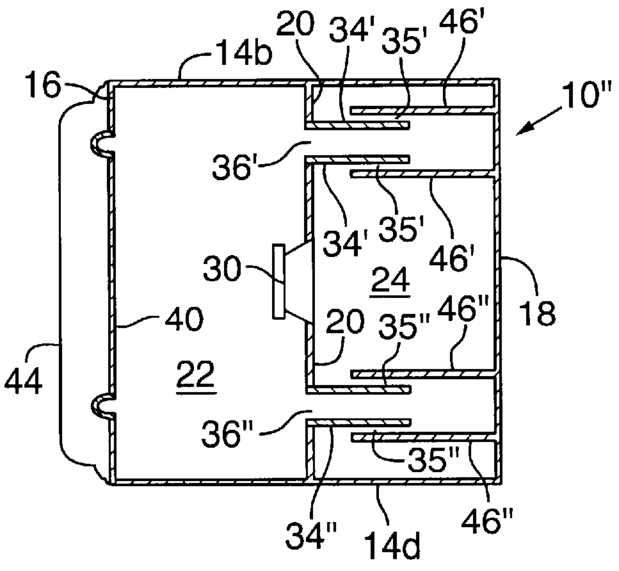
FIG. 7 is a side cross-sectional view of the dual-chamber loudspeaker of FIG. 5, taken along line 7—7 of FIG. 1.

A third preferred embodiment of the loudspeaker 10" of the present invention is disclosed in FIGS. 5–7, and it has the same overall exterior appearance and size as shown in FIG. 1. In general, the loudspeaker 10" of this embodiment has the same general elements and construction of the first preferred embodiment, and is presented to show an alternative preferred configuration of the arrangement of these elements. Accordingly, in order to avoid undue repletion, unless specifically identified otherwise below, reference numerals refer to like numbered elements having a like orientation and configuration as those elements identified in the discussion of the first preferred embodiment.

In order to further minimize the amount of asymmetric deflection of the drone cone 40 caused by air exiting the elongated vent 34 (FIG. 4A) during operation of the loudspeaker 10", the third preferred embodiment uses a plurality of elongated vents 34', 34" between the front and back chambers, 22, 24, respectively. In particular, and as best shown in FIGS. 6 & 7, there are at least two elongated vents 34', 34" spaced equal distance from the centrally-aligned driver 30 and from each other. Preferably, each elongated vent 34', 34" is encircled by a corresponding elongated concentric vent 46', 46" respectively, defining respective gaps 35', 35" therebetween as shown, thereby allowing easy tuning of the chambers 22, 24, as previously disclosed.

It can be appreciated that when multiple vents 34', 34" are used in place of a single elongated vent 34 (FIG. 4A) between the front and rear chambers 22, 24, respectively, the total volume of air deflected through the vents should remain the same. Accordingly, the diameter of each elongated vent, 34', 34", and its corresponding port hole 36', 36", should be reduced so that the multiple vents 34', 34" of this embodiment deflect the same total volume of air as displaced with the single vent 34 of the first preferred embodiment.

More preferably, each elongated vent 34', 34" is aligned so that the drone cone 40 overlaps only a portion of each elongated vent 34', 34", preferably at the outer diameter of the drone cone 40 when viewed from the front of the loudspeaker 10", with the elongated vents 34', 34" spaced equal distance from each other along the outer diameter of the drone cone 40.

The multiple vents between the front and rear chambers 22, 24, respectively, allow air passing between the chambers to be directed evenly around the drone cone 40, thereby further minimizing the likelihood of such forces causing asymmetrical deflection of the drone cone 40 and thereby improving sound quality.

Having described and illustrated the principles of our invention with reference to a preferred embodiment thereof, it will be apparent that the invention can be modified in arrangement and detail without departing from such principles. For example, although the third preferred embodiment shows two elongated vents 34', 34" extending between the front and rear chambers, any number of vents can be used so long as they are evenly space from each other such that they do not apply an asymmetrical force on the drone cone 40.

In view of the many possible embodiments to which the principles may be put, it should be recognized that the detailed embodiment is illustrative only and should not be taken as limiting the scope of our invention. Accordingly, we claim as our invention all such modifications as may come within the scope and spirit of the following claims and equivalents thereto.

We claim:

1. A loudspeaker comprising:

a housing having a partition therein defining a front chamber and a back chamber, both chambers being pneumatically sealed from the outside environment;

a driver secured to said partition and in pneumatic and acoustic communication between said front and back chambers;

a drone cone in pneumatic and acoustic communication between said front chamber and the outside environment; and, a vent in pneumatic and acoustic communication between said front and back chambers, said vent includes:

a hollow elongated cylinder; and a hollow concentric cylinder encircling at least a portion of said elongated cylinder defining a gap therebetween;

wherein air can travel between said front and rear chambers by traveling through said elongated cylinder, said concentric cylinder and said gap, and wherein the resonance frequency of each said chamber may be tuned by adjusting the length and size of said elongated cylinder and said concentric cylinder.

2. The loudspeaker of claim 1, wherein said drone cone is secured to a substantially planer outer panel, and said partition is substantially planar and aligned substantially parallel with said outer panel, and wherein said drone cone has an outer diameter, and said vent is aligned to overlap said outer diameter of said drone cone when viewed from the outer panel.

3. The loudspeaker of claim 2, wherein said housing in substantially cube shaped.

4. The loudspeaker of claim 1, wherein said loudspeaker is tuned to operate as a series-vented band-pass alignment subwoofer.

5. The loudspeaker of claim 4, wherein the back chamber has a low frequency cut-off of about 35 Hz, and the front chamber has a high frequency cut-off of about 150 Hz.

6. The loudspeaker of claim 4, wherein the back chamber has a low frequency cut-off of about 35 Hz, and the front chamber has a high frequency cut-off of about 150 Hz.

7. The loudspeaker of claim 1, wherein said drone cone is secured to a substantially planar outer panel, and said partition is substantially planar and aligned substantially parallel with said outer panel, and said driver is centrally aligned with said drone cone when viewed from a front panel.

8. The loudspeaker of claim 1, wherein said drone cone is substantially flat.

9. The loudspeaker of claim 1, wherein said drone cone has a larger diameter than said driver.

10. The loudspeaker of claim 1, wherein said drone cone has a lower self-resonance than said driver.

11. The loudspeaker of claim 1, wherein said driver is directed to face into said back chamber.

12. The loudspeaker of claim 1, wherein said driver is directed to face into said front chamber.

13. The loudspeaker of claim 1, further including a raised screen secured to said housing and covering said drone cone, thereby protecting said drone cone without compromising operation of said drone cone.

14. A loudspeaker comprising:

a housing having a partition therein defining a front chamber and a back chamber, both chambers being pneumatically sealed from the outside environment;

a driver secured to said partition and in pneumatic and acoustic communication between said front and back chambers;

a vent in pneumatic and acoustic communication between said front and back chambers; and, a drone cone in pneumatic and acoustic communication between said front chamber and the outside environment;

wherein said loudspeaker is tuned to operate as a series-vented band-pass alignment subwoofer, the back chamber has a low frequency cut-off of about 35 Hz, and the front chamber has a high frequency cut-off of about 150 Hz.

15. The loudspeaker of claim 14, wherein said drone cone is secured to a substantially planar outer panel, and said partition is substantially planar and aligned substantially parallel with said outer panel, and said driver is centrally aligned with said drone cone when viewed from a front panel.

16. The loudspeaker of claim 14, wherein said drone cone is substantially flat.

17. The loudspeaker of claim 14, wherein said drone cone has a larger diameter than said driver.

18. The loudspeaker of claim 14, wherein said drone cone has a lower self-resonance than said driver.

19. The loudspeaker of claim 14, wherein said vent is a hollow elongated cylindrical tube.

20. The loudspeaker of claim 14, wherein said driver is directed to face into said back chamber.

21. The loudspeaker of claim 14, wherein said driver is directed to face into said front chamber.

22. The loudspeaker of claim 14, further including an electronics frame received within one of the front or back chambers, wherein loudspeaker electronics secured to the frame are cooled by the flow of air passing between the two chambers during operation of the loudspeaker.

23. The loudspeaker of claim 14, further including a raised screen secured to said housing and covering said drone cone, thereby protecting said drone cone without compromising operation of said drone cone.

24. A loudspeaker comprising:

a housing having a partition therein defining a front chamber and a back chamber, both chambers being pneumatically sealed from the outside environment;

a driver secured to said partition and in pneumatic and acoustic communication between said front and back chambers;

a plurality of vents in pneumatic and acoustic communication between said front and back chambers; each vent of said plurality of vents spaced equal distance from said driver and each other; and a drone cone in pneumatic and acoustic communication between said front chamber and the outside environment;

wherein said drone cone is secured to a substantially planar outer panel, and said partition is substantially planar and aligned substantially parallel with an outer panel, and said driver is centrally aligned with said drone cone when viewed from the outer panel.

25. The loudspeaker of claim 24, wherein said drone cone as an outer diameter, and said plurality of vents are aligned such that each vent of said plurality of vents overlap said outer diameter of said drone cone when viewed from the outer panel.

26. A loudspeaker comprising:

a housing having a partition therein defining a front chamber and a back chamber, both chambers being pneumatically sealed from the outside environment;

a driver secured to said partition and in pneumatic and acoustic communication between said front and back chambers;

a drone cone in pneumatic and acoustic communication between said front chamber and the outside environment; and, a vent in pneumatic and acoustic communication between said front and back chambers, said vent includes:

an elongated vent; and an elongated hollow concentric vent sealed at one end and encircling a portion of said elongated vent at said concentric vent's opposite end defining a gap therebetween;

wherein said front and back chambers are pneumatically connected through said elongated vent, said concentric vent and said gap.

27. The loudspeaker of claim 26, further including a plurality of vents spaced equal distance from each other, thereby evenly distributing a pneumatic load between the front and rear chambers during operation of the loudspeaker.

28. The loudspeaker of claim 26, wherein said driver is directed to face into said back chamber.

29. The loudspeaker of claim 26, wherein said driver is directed to face into said front chamber.

30. The loudspeaker of claim 26, further including an electronics frame received within one of the front or back chambers, wherein loudspeaker electronics secured to the frame are cooled by the flow of air passing between the two chambers during operation of the loudspeaker.

31. A loudspeaker comprising:

a housing having an outer panel and a partition therein defining a front chamber and a back chamber, both chambers being pneumatically sealed from the outside environment;

a driver secured to said partition and in pneumatic and acoustic communication between said front and back chambers; and, a drone cone secured to said outer panel of said housing, said drone cone having an outer diameter and in pneumatic and acoustic communication between said front chamber and an outside environment; and, a plurality of vents secured to said partition and in pneumatic and acoustic communication between said front and back chambers, said plurality of vents aligned to overlap said outer diameter of said drone cone when viewed from an outer panel, and said plurality of vents spaced equally apart from the driver and evenly apart from each other such that they distribute pneumatic load evenly within the front and rear chambers.

32. The loudspeaker of claim 31, wherein each of said plurality of vents includes:

an elongated hollow cylinder; and an elongated hollow concentric cylinder sealed at one end and encircling a portion of said elongated cylinder at said concentric cylinder's opposite end defining a gap therebetween;

wherein said front and back chambers are pneumatically connected through said elongated hollow cylinder, said concentric cylinder, and said gap.

33. The loudspeaker of claim 32, wherein said panel is a substantially planar front panel, and said partition is aligned substantially parallel with said front panel.

34. The loudspeaker of claim 31, wherein said driver is directed to face into said back chamber.

35. The loudspeaker of claim 31, wherein said housing is substantially cube shaped.

36. A loudspeaker comprising:

a housing having an outer panel and a partition therein defining a front chamber and a back chamber, both chambers being pneumatically sealed from the outside environment;

a driver secured to said partition and in pneumatic and acoustic communication between said front and back chambers; and, a drone cone secured to said outer panel of said housing, said drone cone in pneumatic and acoustic communication between said front chamber and an outside environment; and, a plurality of vents secured to said partition and in pneumatic and acoustic communication between said front and back chambers, said vents spaced equally apart from the driver and evenly apart from each other such that they distribute pneumatic load evenly within the front and rear chambers, wherein said loudspeaker is tuned to operate as a series-vented band-pass alignment subwoofer with the back chamber having a low frequency cut-off of about 35 Hz, and the front chamber having a high-frequency cut-off of about 150 Hz.

37. The loudspeaker of claim 36, wherein said drone cone is substantially flat.

38. The loudspeaker of claim 36, wherein said drone cone has a larger diameter than said driver.

39. The loudspeaker of claim 36, wherein said drone cone has a lower self-resonance than said driver.

40. A loudspeaker comprising:

a housing having partition therein defining a front chamber and a back chamber, each chamber having a resonance frequency when used with a pressure resonant device;

a driver secured to said partition and in pneumatic and acoustic communication between said front and back chambers;

a passive resonant device secured to said housing and in pneumatic and acoustic communication between said front chamber and the outside environment; and a vent in pneumatic and acoustic communication between said front and back chambers, said vent including:

a hollow elongated cylinder; and a hollow concentric cylinder encircling at least a portion of said elongated cylinder defining a gap therebetween;

wherein air can travel between said front and rear chambers by traveling through said elongated cylinder, said concentric cylinder and said gap, and wherein the resonance frequency of each said chamber may be tuned by adjusting the length and size of said elongated cylinder and said concentric cylinder.

41. The loudspeaker of claim 40, wherein said passive resonant device is a drone cone.

42. The loudspeaker of claim 41, wherein said drone cone is substantially flat.

43. The loudspeaker of claim 40, further including a plurality of said vents, spaced equally distance from each other such that they distribute pneumatic load evenly within the front and rear chambers.

44. The loudspeaker of claim 40, wherein said drone cone is secured to a substantially planar outer panel, and said partition is substantially planar and aligned substantially parallel with said outer panel, and wherein said drone cone has an outer diameter, and each of said plurality of vents are aligned to overlap said outer diameter of said drone cone when viewed from the outer panel.

45. A loudspeaker comprising:

a housing having a substantially planar front panel, and a substantially planar partition therein, said partition defining a front chamber and a back chamber;

a driver secured to said partition and in pneumatic and acoustic communication between said front and back chambers;

a first passive resonant device secured to said partition and in pneumatic and acoustic communication between said front and back chambers; and a second passive resonant device aligned substantially parallel with said first passive resonant device and secured to said front panel of said housing, said second passive resonant device in pneumatic and acoustic communication between said front chamber and an outside environment;

wherein said second passive resonant device overlaps only a portion of said first resonant device when viewed from the front panel of the loudspeaker.

46. The loudspeaker of claim 45, wherein said driver is centrally aligned with said second passive resonant device when viewed from the front panel, and further including a plurality of first passive resonant devices spaced equal distance from each other and said driver, thereby evenly distributing a pneumatic load between the front and rear chambers during operation of the loudspeaker.

47. The loudspeaker of claim 45, wherein said loudspeaker is tuned to operate as a series-vented band-pass alignment subwoofer with the back chamber having low frequency cut-off of about 35 Hz, and the front chamber having a high frequency cut-off of about 150 Hz.

48. The loudspeaker of claim 45, wherein said first passive resonant device is a vent, said second resonant device is a sealed drone cone, and said front and back chambers are pneumatically sealed from the outside environment.

49. The loudspeaker of claim 48, wherein said drone cone as an outer diameter, and said plurality of first passive resonant devices are aligned to overlap said outer diameter of said drone cone when viewed from the front panel.

50. The loudspeaker of claim 48, wherein said drone cone is substantially flat.

51. The loudspeaker of claim 48, wherein said drone cone has a larger diameter than said driver.

52. The loudspeaker of claim 48, wherein said drone cone has a lower self-resonance than said driver.

53. A loudspeaker comprising:

a housing having a partition therein defining a front chamber and a back chamber, both chambers being pneumatically sealed from the outside environmuent;

a driver secured to said partition and in pneumatic and acoustic communication between said front and back chambers;

an elongated concentric vent in pneumatic and acoustic communication between said front and back chambers;

a drone cone in pneumatic and acoustic communication between said front chamber and the outside environment, said drone cone has a lower self-resonance than said driver; and an electronics frame received within one of the front or back chambers, said housing having a back side, and said electronics frame detachably secured to the back side of said chamber wherein loudspeaker electronics secured to the frame are cooled by the flow of air passing between the two chambers during operation of the loudspeaker.

54. The loudspeaker of claim 53, further including a raised screen secured to said housing and covering said drone cone, thereby protecting said drone cone without compromising operation of said drone cone.

55. The loudspeaker of claim 53, wherein said drone cone is substantially flat.

56. The loudspeaker of claim 53, wherein said drone cone has a larger diameter than said driver.

57. The loudspeaker of claim 53, wherein said driver is directed to face into said back chamber.

58. The loudspeaker of claim 53, wherein said driver is directed to face into said front chamber.

59. The loudspeaker of claim 53, wherein said housing in substantially cube shaped.

* * * * *